US008497978B2

(12) United States Patent
Miyaharu (10) Patent No.: US 8,497,978 B2
(45) Date of Patent: Jul. 30, 2013

(54) EXPOSURE APPARATUS AND METHOD OF MANUFACTURING DEVICE

(75) Inventor: Takafumi Miyaharu, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 196 days.

(21) Appl. No.: 12/827,729

(22) Filed: Jun. 30, 2010

(65) Prior Publication Data
US 2011/0001946 A1    Jan. 6, 2011

(30) Foreign Application Priority Data

Jul. 1, 2009   (JP) .................................. 2009-157316

(51) Int. Cl.
| G03B 27/54 | (2006.01) |
| G03B 27/68 | (2006.01) |
| G03B 27/52 | (2006.01) |
| G03B 27/58 | (2006.01) |
| G03B 27/72 | (2006.01) |
| G03B 27/32 | (2006.01) |

(52) U.S. Cl.
USPC ................... 355/67; 355/52; 355/55; 355/71; 355/72; 355/77

(58) Field of Classification Search
USPC ..... 355/52, 53, 55, 67–71, 72, 77; 250/492.1, 250/492.2, 492.22, 548; 356/124, 124.5, 356/399–401, 614–623
See application file for complete search history.

(56) References Cited

U.S. PATENT DOCUMENTS

| 4,920,505 | A | * | 4/1990 | Suzuki | 399/51 |
| 5,475,491 | A | * | 12/1995 | Shiozawa | 356/394 |
| 6,040,894 | A | * | 3/2000 | Takahashi | 355/53 |
| 6,333,777 | B1 | * | 12/2001 | Sato | 355/53 |
| 6,721,039 | B2 | * | 4/2004 | Ozawa | 355/69 |
| 7,573,563 | B2 | * | 8/2009 | Yamazoe et al. | 355/71 |
| 2006/0077371 | A1 | * | 4/2006 | Wegmann et al. | 355/67 |
| 2006/0152700 | A1 | * | 7/2006 | Yamada | 355/55 |
| 2006/0170901 | A1 | * | 8/2006 | Tanitsu et al. | 355/71 |
| 2006/0192937 | A1 | * | 8/2006 | Kerkhof et al. | 355/71 |
| 2007/0046922 | A1 | * | 3/2007 | Kadono et al. | 355/71 |
| 2007/0188730 | A1 | * | 8/2007 | Takeuchi et al. | 355/71 |
| 2008/0316448 | A1 | * | 12/2008 | Ohsaki | 355/53 |
| 2009/0035671 | A1 | * | 2/2009 | Shinoda | 430/30 |

FOREIGN PATENT DOCUMENTS

| JP | 11-260688 A | 9/1999 |
| JP | 2000-019012 A | 1/2000 |
| JP | 2001-267239 A | 9/2001 |
| JP | 3414476 B2 | 6/2003 |
| JP | 2005-158828 A | 6/2005 |

(Continued)

OTHER PUBLICATIONS

TW Office Action issued Mar. 25, 2013 for corresponding TW Appln No. 099120658.

Primary Examiner — Toan Ton
Assistant Examiner — Christina Riddle
(74) Attorney, Agent, or Firm — Rossi, Kimms & McDowell LLP (57) ABSTRACT

An exposure apparatus includes an illumination system which illuminates an original, a projection optical system which projects a pattern of the original onto a substrate, a measurement device configured to measure optical characteristics of at least one of the illumination system or the projection optical system, and a control unit configured to correct, the measurement results obtained by the measurement device, depending on a polarization state included in illumination light from the illumination system.

8 Claims, 6 Drawing Sheets

FOREIGN PATENT DOCUMENTS

| | | |
|---|---|---|
| JP | 2006-179660 A | 7/2006 |
| TW | 226976 B | 1/2005 |
| TW | 310485 B | 6/2009 |

\* cited by examiner

EXPOSURE APPARATUS AND METHOD OF MANUFACTURING DEVICE

BACKGROUND OF THE INVENTION

1. Field of the Invention

The present invention relates to an exposure apparatus and a method of manufacturing a device using the same.

2. Description of the Related Art

An exposure apparatus includes a measurement device that measures exposure light. Various types of mechanical adjustment and optical adjustment can be performed based on the measurement results obtained by the measurement device. The σ value (effective light source distribution) of an illumination system and the transmittance distribution in the pupil of a projection optical system, for example, can be measured using a measurement device mounted on a wafer stage.

It is known that an image with high contrast is obtained by S-polarizing diffracted light which strikes a resist, so a polarized illumination mode in which the diffracted light is S-polarized is used. Even a measurement device which can obtain sufficiently high measurement precision in a non-polarized illumination mode may generate measurement errors (measurement noise) which depend on the polarization characteristics of a glass plate, lens, film, and photo sensor in polarized illumination.

SUMMARY OF THE INVENTION

The present invention provides a technique advantageous to reduce measurement errors which depend on the polarization state.

One of the aspects of the present invention provides an exposure apparatus including an illumination system which illuminates an original, and a projection optical system which projects a pattern of the original onto a substrate, the apparatus comprising a measurement device configured to measure optical characteristics of at least one of the illumination system and the projection optical system, and a control unit configured to correct, the measurement results obtained by the measurement device, depending on a polarization state included in illumination light from the illumination system.

Further features of the present invention will become apparent from the following description of exemplary embodiments with reference to the attached drawings.

DESCRIPTION OF THE EMBODIMENTS

The embodiments of the present invention will be described below with reference to the accompanying drawings. The same reference numerals denote the same components throughout the drawings.

Figure 1:
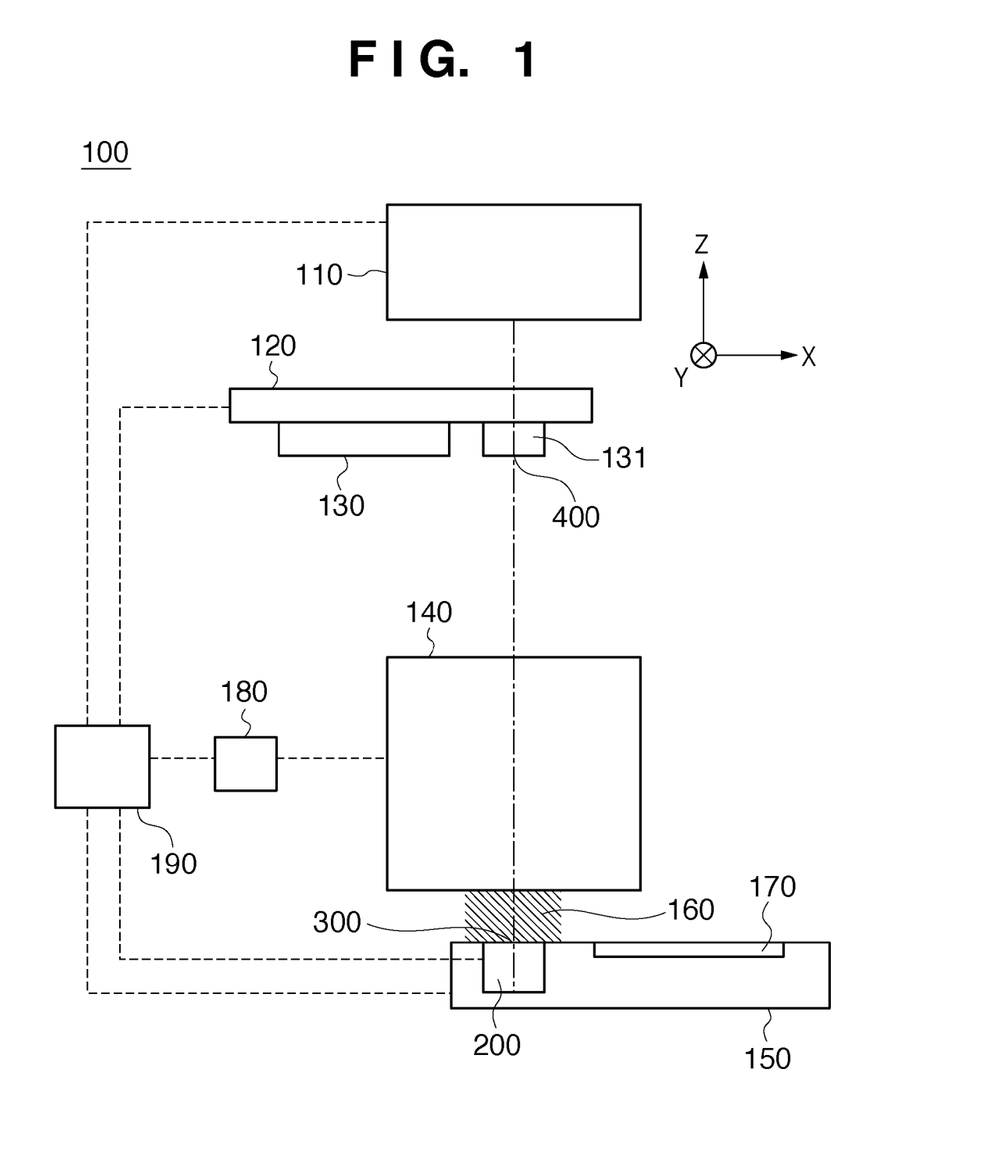
FIG. 1 is a view showing the arrangement of an exposure apparatus according to an embodiment of the present invention.

The arrangement of an exposure apparatus 100 according to an embodiment of the present invention will be described first with reference to FIG. 1. The exposure apparatus 100 includes an illumination system 110, a reticle stage (original stage) 120 which holds a reticle (original) 130, a projection optical system 140, and a wafer stage (substrate stage) 150 which holds a wafer (substrate) 170. The exposure apparatus 100 also includes an adjusting unit 180, control unit 190, and measurement device 200.

In this embodiment, the exposure apparatus 100 serves as an immersion exposure apparatus. The final surface (the surface facing the wafer 170 or the wafer stage 150) of the projection optical system 140 is partially or wholly filled with a liquid 160, and the pattern of the reticle 130 is projected onto the wafer 170 via the projection optical system 140 and liquid 160. Note that the present invention is also applicable to exposure apparatus (dry exposure apparatus) other than an immersion exposure apparatus. Although the exposure apparatus 100 is of the step & scan scheme in this embodiment, the present invention is also applicable to other exposure schemes such as the step & repeat scheme.

The illumination system 110 includes a light source and illumination optical system, and is configured to illuminate the reticle 130 on which a pattern is formed. The light source can include, for example, a laser. The laser mentioned herein can be, for example, a pulsed laser such as an ArF excimer laser which emits light with a wavelength of about 193 nm, a KrF excimer laser which emits light with a wavelength of about 248 nm, or an $F_2$ laser which emits light with a wavelength of about 157 nm. The type and number of lasers are not particularly limited, and the type of light source is not particularly limited, either.

The illumination optical system guides light from the light source to the reticle 130, and includes, for example, a lens, mirror, light integrator, and stop. The light integrator includes, for example, an integrator formed by stacking fly-eye lenses or a pair of cylindrical lens array (or lenticular lens) plates, but is sometimes substituted by an optical rod or a diffraction element. The illumination optical system can be used for both on-axis light and off-axis light.

The illumination optical system includes, for example, a polarization beam splitting film in order to control the polarization state of illumination light (exposure light). The polarization beam splitting film is formed on a plane-parallel plate, and generally transmits light P-polarized with respect to the plane of incidence on the plane-parallel plate and reflects light S-polarized with respect to that plane of incidence. Plane-parallel plates on which polarization beam splitting films are formed and which are tilted in the Y and X directions, respectively, are used in this case, and one of them is selectively inserted into the optical path. Alternatively, a plane-parallel plate whose tilt direction is variable can be used. This makes it possible to realize both polarized illumination advantageous for a repetitive pattern in the X direction and that advantageous for a repetitive pattern in the Y direction. The illumination optical system can be configured to realize various types of polarization states and effective light source distributions (light intensity distributions), in addition to the foregoing types of illumination.

The reticle 130 has a circuit pattern formed on the surface of, for example, a quartz plate on it, and is driven by a driving mechanism while being held by the reticle stage 120. Light diffracted by the reticle 130 illuminated by the illumination system 110 strikes the surface of the wafer 170 via the projection optical system 140 and liquid 160 to form a circuit pattern image on the wafer 170. The reticle 130 and wafer 170 are positioned optically conjugate to each other. The pattern of the reticle 130 is transferred onto a resist applied on the wafer 170 by exposing the wafer 170 while synchronously scanning the reticle 130 and wafer 170. Note that an exposure apparatus of the step & repeat scheme (that is, a stepper) exposes the wafer 170 while the reticle 130 and wafer 170 stand still.

The reticle stage 120 and projection optical system 140 are supported by, for example, a supporting structure supported through a damper or another member by a base frame supported by a floor or another surface. The driving mechanism for driving the reticle stage 120 can include, for example, a linear motor. The reticle stage 120 includes a reticle-side reference plate 131 placed on it. A pattern (reticle-side pattern) 400 of the reticle-side reference plate 131 is nearly flush with the pattern surface of the reticle 130. The pattern 400 may be formed not only on the reticle-side reference plate 131 but also on the reticle 130.

The projection optical system 140 forms, on the wafer 170, an image of light diffracted by the pattern formed on the reticle 130. The projection optical system 140 can be an optical system including only a plurality of lens elements. Alternatively, the projection optical system 140 can be an optical system (catadioptric system) including a plurality of lens elements and at least one concave mirror. The projection optical system 140 can also be an optical system including a plurality of lens elements and at least one diffraction optical element such as a kinoform. When chromatic aberration correction is necessary, a plurality of lens elements made of glass materials with different degrees of dispersion (Abbe numbers) can be used, or the diffraction optical element can be configured to generate dispersion in a direction opposite to that of dispersion generated by the lens elements.

The wafer 170 is one example of a substrate to be exposed, and has its surface coated with a photoresist. Another example of the substrate is a plate such as a glass plate for manufacturing a display device. The wafer stage 150 is driven by a driving mechanism while holding the wafer 170. The driving mechanism includes, for example, a linear motor. The wafer stage 150 is controlled in six axial directions: the X, Y, and Z-axis directions and rotation directions about the respective axes by the driving mechanism. The reticle stage 120 and wafer stage 150 can be driven at a constant speed ratio by monitoring their positions using, for example, laser interferometers. The wafer stage 150 can be placed on a stage base supported through a damper by a floor or another surface.

A substance which has a high transmittance for the wavelength of light for use in exposure, does not cause dirt to adhere to the projection optical system 140, and has a high degree of matching with the resist process is selected as the liquid 160 supplied between the final surface of the projection optical system 140 and the wafer 170 or wafer stage 150. In addition, a substance with a refractive index higher than 1 is selected as the liquid 160 in order to increase the NA of the projection optical system 140. The difference in refractive index between the liquid 160 and a refractive member (lens) which forms the final surface of the projection optical system 140 can be compensated for by a coating.

The adjusting unit 180 is a mechanism for driving the optical elements (lens elements) which constitute the projection optical system 140. The adjusting unit 180 adjusts the wavefront aberration, focus, and distortion of the projection optical system 140 by controlling the decentering and tilt of the axis of each optical element and the distances between the optical elements.

The control unit 190 has, for example, a function of determining optimum exposure conditions and a function of issuing commands to the driving mechanisms of the reticle stage 120 and wafer stage 150 and the adjusting unit 180. The control unit 190 determines optimum exposure conditions based on, for example, the measurement result obtained by the measurement device 200, and issues commands corresponding to the exposure conditions to the illumination system 110, reticle stage 120, wafer stage 150, and adjusting unit 180.

The measurement device 200 can be used to measure the optical characteristics of at least one of the illumination system 110 and the projection optical system 140. The measurement device 200 includes a measurement pattern (to be referred to as a "wafer-side pattern" hereinafter) 300. The space between the projection optical system 140 and the measurement device 200 can be filled with the liquid 160 during measurement by the measurement device 200. The optical characteristics can include, for example, the wavefront aberration of the projection optical system 140, the polarization state of light transmitted through the projection optical system 140, the numerical aperture of the projection optical system 140, the transmittance in the pupil of the projection optical system 140, the light intensity distribution in the pupil (or illumination σ or effective light source distribution) of the illumination system 110, or the polarization state of light transmitted through the illumination system 110. Alternatively, the optical characteristics can include other optical characteristics associated with the performance of the exposure apparatus.

Each of the wafer-side pattern 300 and reticle-side pattern 400 for measuring optical characteristics can be formed from a pinhole, a square or rectangular opening, and a light-shielding film. The opening may be a pinhole or slit which gives rise to ideal diffraction with a period shorter than the wavelength of the light source or may have a size large enough to pass light intact. Also, the opening may include a diffraction grating. The slit or the diffraction grating can be oriented in an arbitrary direction (for example, 0°, 90°, 45°, or 135°) with reference to, for example, the X-axis. The diffraction grating may have, for example, a line-and-space pattern or a two-dimensional pattern. The opening used may be a single opening or a combination of a plurality of openings. Although the wafer-side pattern 300 and reticle-side pattern 400 can be placed on the object plane and image plane, respectively, of the projection optical system 140, they may be placed at positions defocused from these planes.

Figure 2A:
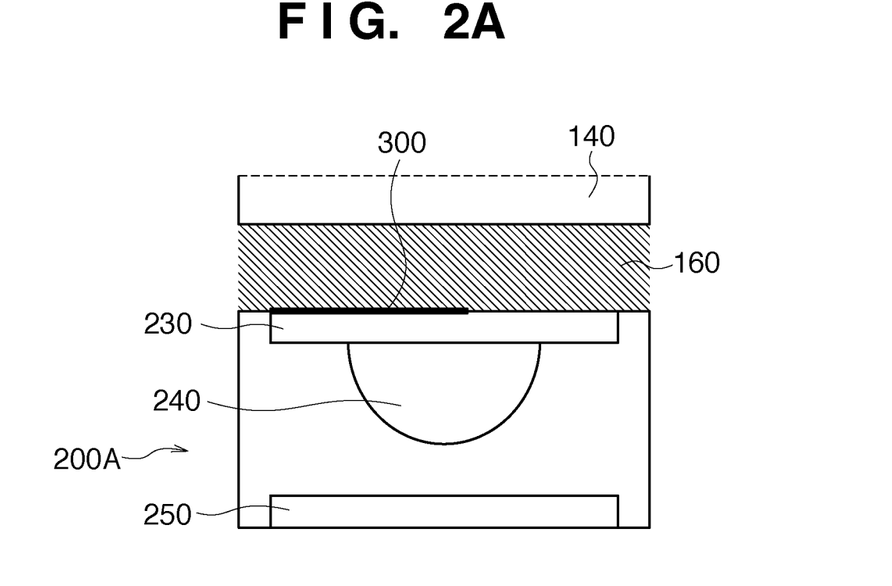
FIGS. 2A and 2B are views showing examples of the detailed arrangement of a measurement device.
Figure 2B:
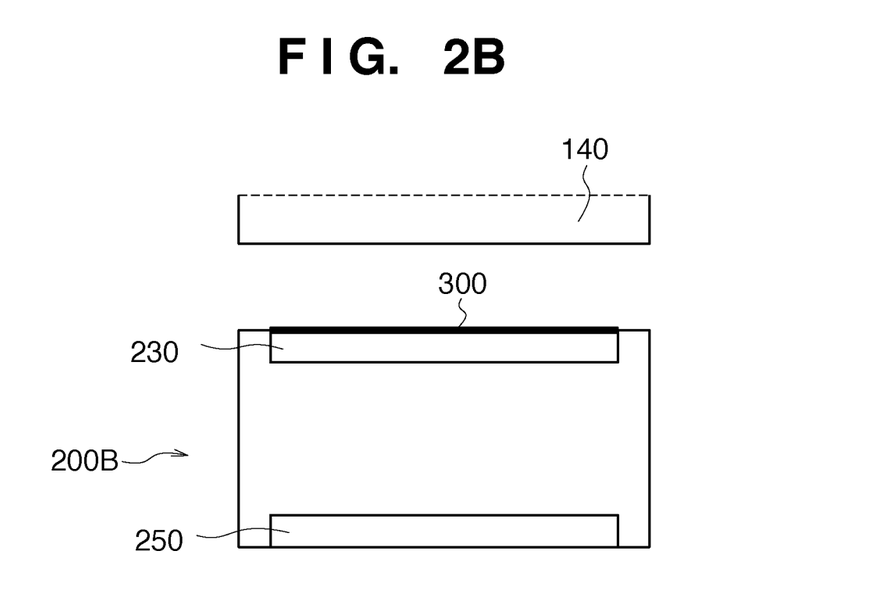

FIGS. 2A and 2B illustrate measurement devices 200A and 200B, respectively, as examples of the detailed arrangement of the measurement device 200. The measurement device 200A can be used in an immersion exposure apparatus. During the use of the measurement device 200A, the space between the upper surface of the measurement device 200A and the final surface of the projection optical system 140 is filled with the liquid 160. The measurement device 200A includes a glass substrate 230 and planoconvex lens 240 serving as optical elements which transmit light, and a photo sensor 250 which detects the light transmitted through these optical elements. At least one of the optical elements and the photo sensor 250 has polarization characteristics corresponding to an illumination mode (especially a polarized illumination mode). The glass substrate 230 has the wafer-side pattern 300 formed on it. The planoconvex lens 240 has its flat surface portion in close proximity to the glass substrate 230 at a distance equal to or shorter than the wavelength of the light source. This makes it possible to prevent the light having passed through the wafer-side pattern 300 to be totally reflected by the lower surface of the glass substrate 230. The space between the planoconvex lens 240 and the photo sensor 250 may be filled with a gas such as air or an inert gas, as in the prior arts, or may be filled with a high index liquid such as the liquid 160.

The measurement device 200A may include a polarizer and an analyzer in order to measure the polarization state of light which passes through the projection optical system 140. The glass substrate 230 and planoconvex lens 240 may be integrated as one optical member instead of the above-described proximate placement. The planoconvex lens 240 need not always be a single lens, and may be a system including a plurality of lenses.

An arrangement such as that of the measurement device 200B can be used in a dry exposure apparatus in which the space between the projection optical system 140 and the measurement device 200 is not filled with a liquid. The measurement device 200B includes a glass substrate 230 serving as an optical element that transmits light, and a photo sensor 250 that detects the light transmitted through the optical element. The glass substrate 230 has the wafer-side pattern 300 formed on it, as in the measurement device 200A.

The glass substrate 230 is covered with a light-shielding film in a region other than the wafer-side pattern 300. The light-shielding film serves to block stray light which is emitted by the light source and comes from a region other than the pattern, and is a thin film made of, for example, Cr, Ta, W, or Si. Since the light-shielding film comes into contact with the liquid 160, it desirably does not change the characteristics of the liquid 160 even when light strikes it. Although the photo sensor 250 is desirably an image sensor such as a CCD, it may adopt a scheme of one-dimensionally scanning line sensors or a scheme of two-dimensionally scanning a single light amount sensor.

First Embodiment

In measuring optical characteristics in a polarized illumination mode using a measurement device 200 (a measurement device 200A or 200B), measurement noise may occur depending on the polarization characteristics of a glass substrate 230 and a planoconvex lens 240 or films formed on their surfaces, and of a photo sensor 250.

In the first embodiment of the present invention, when measurement is performed in a polarized illumination mode using the measurement device 200, a light intensity distribution obtained by the photo sensor 250 is corrected using a correction table created based on the polarized light transmittance of the measurement device 200. This makes it possible to measure optical characteristics with high accuracy even in a polarized illumination mode. The polarized light transmittance means herein a transmittance which depends on the direction of vibration of an electric field of light and can be, for example, the S-polarized light transmittance or the P-polarized light transmittance.

Figure 3:
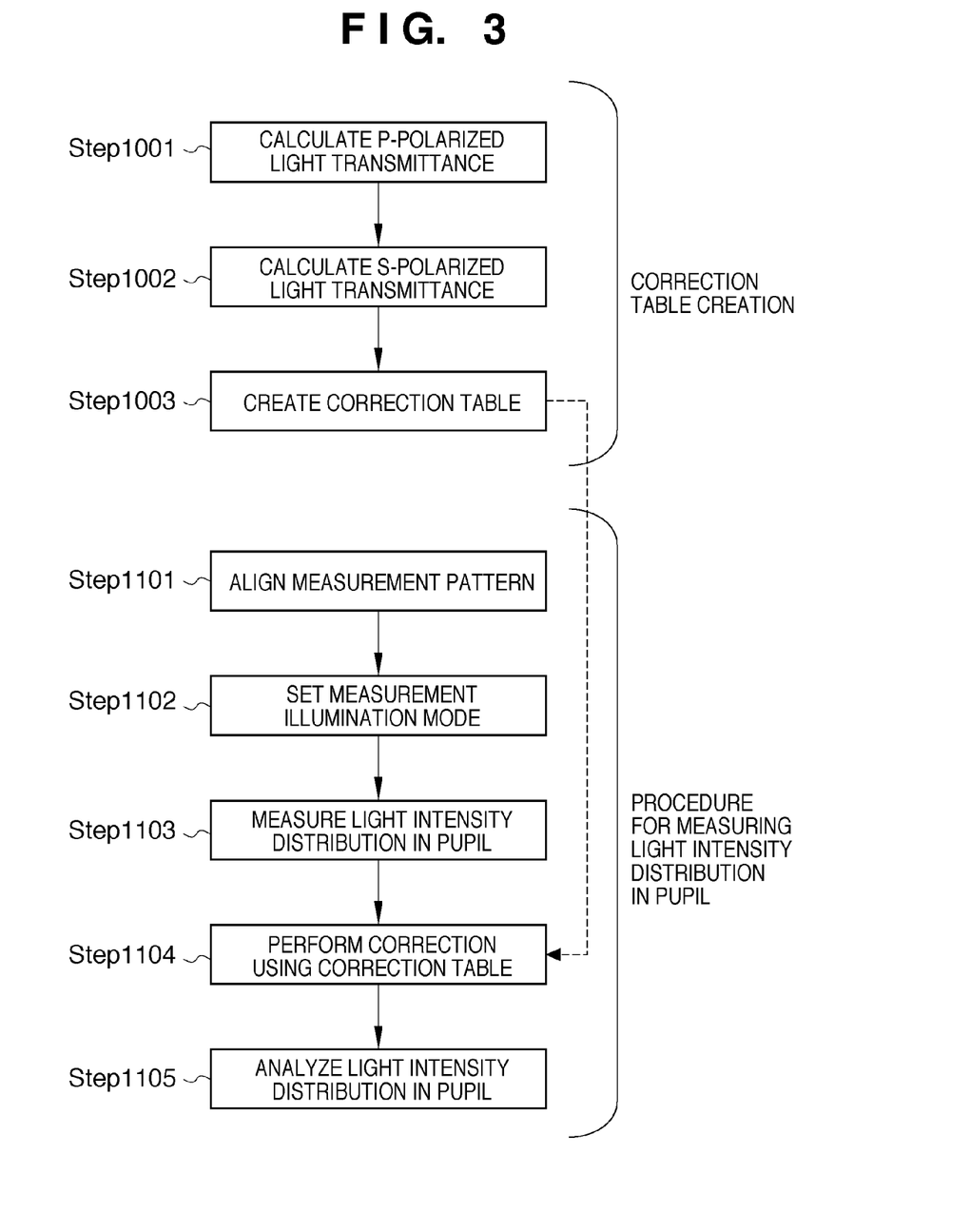
FIG. 3 is a flowchart showing a method of measuring optical characteristics.

FIG. 3 is a flowchart showing a method of measuring optical characteristics. In Step 1001, the P-polarized light transmittance of the measurement device 200 is calculated based on information concerning components (for example, the glass substrate 230, planoconvex lens 240, and photo sensor 250) which constitute the measurement device 200. In Step 1002, the S-polarized light transmittance of the measurement device 200 is calculated, like Step 1001. In Step 1003, a correction table is created based on the P- and S-polarized light transmittances of the measurement device 200. Note that Steps 1001 to 1003 can be executed using a simulator based on, for example, the design values of the measurement device 200.

The measurement device 200A will be taken as an example hereinafter. The measurement device 200A includes a wafer-side pattern 300, the glass substrate 230, the planoconvex lens 240, and the photo sensor 250. The positions where errors are generated in the polarized light transmittance are the wafer-side pattern 300 (the incident surface of the glass substrate 230), the exit surface of the planoconvex lens 240, and the incident surface of the photo sensor 250. First, assuming an arbitrary point on the wafer-side pattern 300 as a starting point, ray tracing is performed from the starting point to the photo sensor 250. The angles at which light from each point in the pupil of an illumination system 110 becomes incident on the glass substrate 230, planoconvex lens 240, and photo sensor 250 are calculated. The polarized light transmittances of the incident surface of the glass substrate 230 and the exit surface of the planoconvex lens 240 depend on the characteristics of films which can be present on their surfaces, and can be calculated by electromagnetic field analysis when the incident angle is known. The polarized light transmittance of the incident surface of the photo sensor 250 can be calculated based on the material and arrangement of the photo sensor 250. At this time, the polarized light transmittance is calculated at each coordinate position in the pupil of the illumination system 110. The polarized light transmittance of the measurement device 200 can be obtained by multiplying together the polarized light transmittances of the incident surface of the glass substrate 230, the exit surface of the planoconvex lens 240, and the incident surface of the photo sensor 250. If the wafer-side pattern 300 includes a plurality of marks, the position where a light beam is transmitted differs for each mark, so a correction table needs to be created for each mark.

During measurement of the light intensity distribution in the pupil of the illumination system 110, a control unit 190 executes Steps 1101 to 1105. In Step 1101, a reticle stage 120 and wafer stage 150 are driven to align a reticle-side pattern 400 and the wafer-side pattern 300. In Step 1102, an illumination mode for use in measurement is set in the illumination system 110. In Step 1103, the light intensity distribution in the pupil of the illumination system 110 is measured. In Step 1104, the light intensity distribution in the pupil measured in Step 1103 is corrected using the correction table created in Step 1003. In Step 1105, the telecentricity, the σ value, and other characteristics of the measured illumination mode are analyzed using the light intensity distribution in the pupil corrected in Step 1104.

The control unit 190 corrects the errors (measurement errors) which depend on the illumination mode and are contained in the measurement result obtained by the measurement device 200 in the foregoing way, and evaluates the optical characteristics based on the corrected measurement result. The control unit 190 can then adjust at least one of the illumination system 110 and a projection optical system 140 based on the evaluation result.

A high-NA exposure apparatus can adopt a polarized illumination mode, set such that diffracted light is S-polarized, in order to improve the resolution. The polarized illumination mode is provided by the illumination system 110. The polarization state of light emitted by a light source can be changed into a target polarization state by a phase plate. A given degree of polarization can be maintained in optical elements downstream of the phase plate by keeping the birefringences of glass materials small. Also, another method can extract only specific polarized light from the illumination light using a linear polarizing filter.

Figure 4:
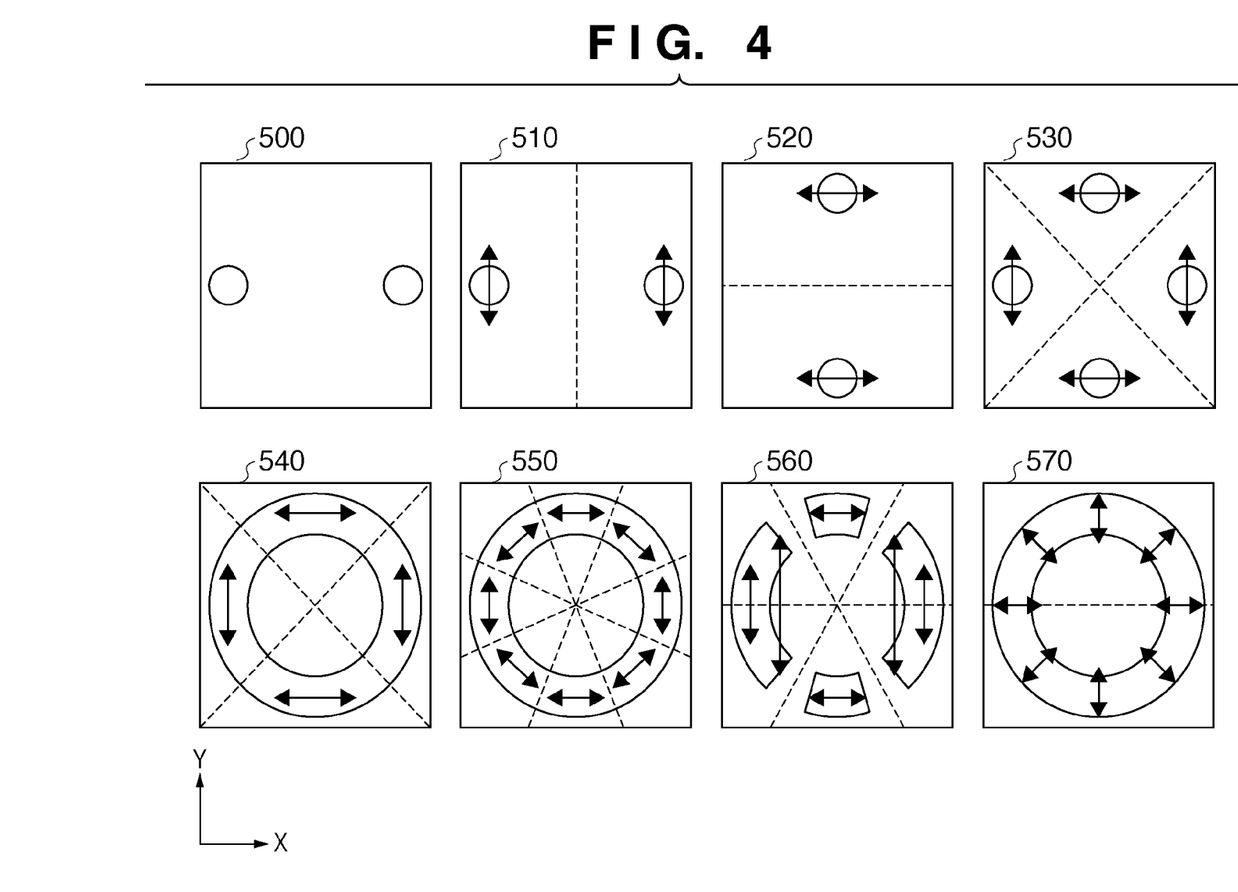
FIG. 4 is a view illustrating the light intensity distributions (effective light source distributions) and the directions of polarization in the pupils of an illumination system and a projection optical system.

FIG. 4 illustrates the light intensity distributions (effective light source distributions) and the directions of polarization in the pupils of the illumination system 110 and projection optical system 140. An illumination mode 500 exploits non-polarized X-dipole illumination. An illumination mode 510 exploits Y-polarized X-dipole illumination in which the poles have directions of vibration parallel to the Y direction and S-polarized light strikes the wafer. An illumination mode 520 is an X-polarized Y-dipole illumination mode. An illumination mode 530 is a tangentially polarized cross-pole illumination mode. Illumination modes 540 and 550 exploit tangentially polarized annular illumination. Note that the illumination mode 540 is realized by a quaternary phase plate, whereas the illumination mode 550 is realized by an octonary phase plate. An illumination mode 560 is the one in which annular illumination is partially eclipsed. The aperture angle differs between the poles in the X direction and those in the Y direction. The poles aligning themselves in the X direction correspond to Y-polarization, whereas those aligning themselves in the Y direction correspond to X-polarization. An illumination mode 570 is an annular illumination mode with directions of vibration perpendicular to the circumferential directions of concentric circles. Various kinds of illumination modes corresponding to the number of combinations of the effective light source distribution (the light intensity distribution in the pupil of the illumination system or projection optical system) and the polarization state (polarization method) are viable.

In this embodiment, correction tables selected in accordance with the illumination mode can be used to correct the measurement result (light intensity distribution) obtained by the measurement device 200. The correction tables can be prepared in advance in association with respective illumination modes, and stored in a memory in the control unit 190 or in a memory that can be accessed by the control unit 190. Note that one correction table can be associated with at least one illumination mode.

Figure 5:
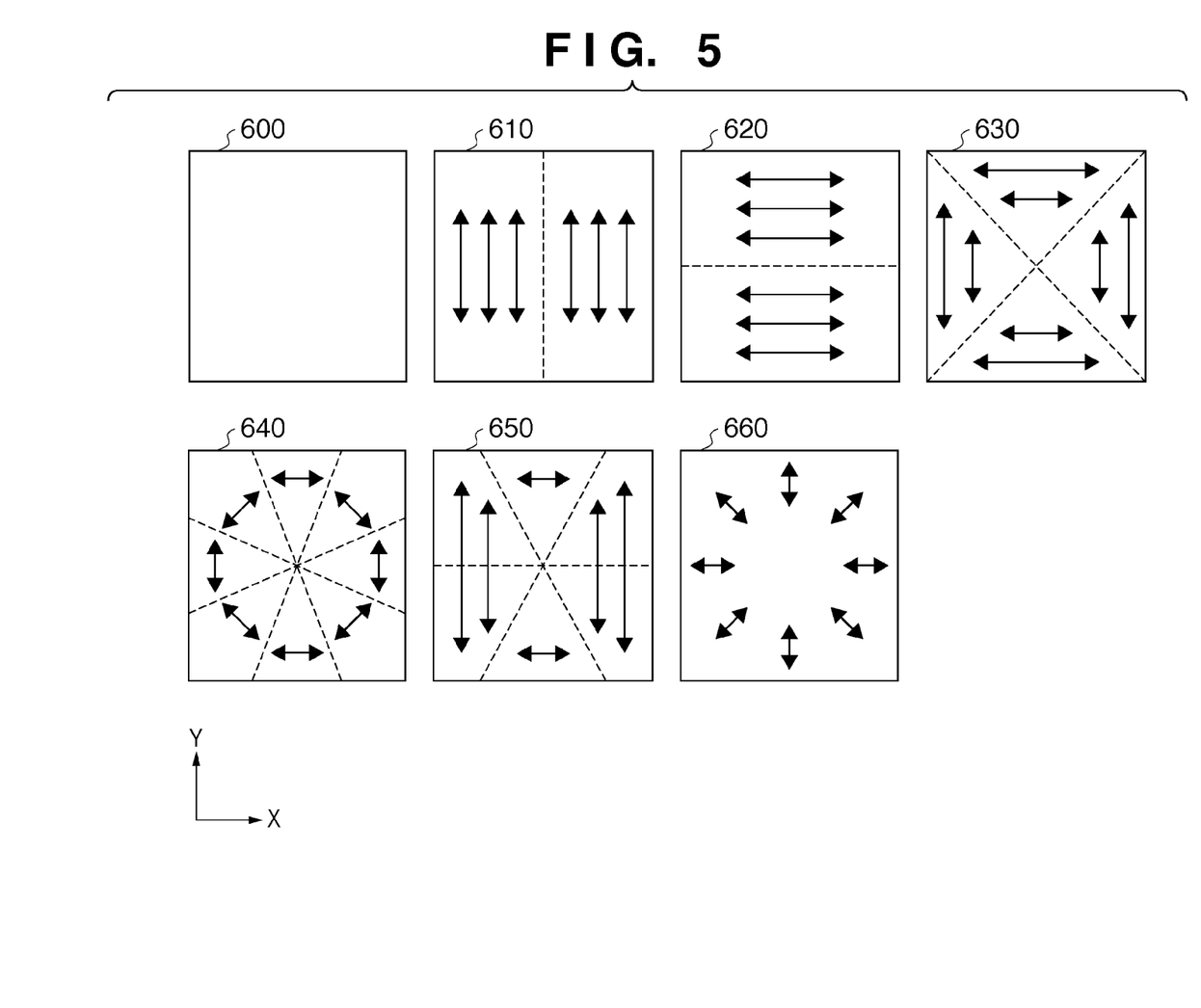
FIG. 5 is a view schematically illustrating correction tables.

FIG. 5 schematically illustrates correction tables. A non-polarization correction table 600 can be used in the non-polarized illumination mode 500. Note that even when the light used is non-polarized, the measurement device 200 can have a transmittance distribution, so the measurement result (transmittance) obtained by the measurement device 200 can be corrected using the correction table 600.

A binary correction table 610 can be used in the illumination mode (Y-polarized X-dipole) 510. A correction table 620 can be used in the illumination mode (X-polarized Y-dipole) 520. A correction table 630 can be used in the illumination modes 530 and 540 in which the pupil is divided into four parts. An octonary correction table 640 can be used in the illumination mode 550 in which the pupil is divided into eight parts. A correction table 650 matching the polarization state of an illumination mode can be used even in the asymmetrical quaternary illumination mode 560. A correction table 660 can be used in the illumination mode 570 although P-polarized light strikes the wafer in this illumination mode.

Figure 6:
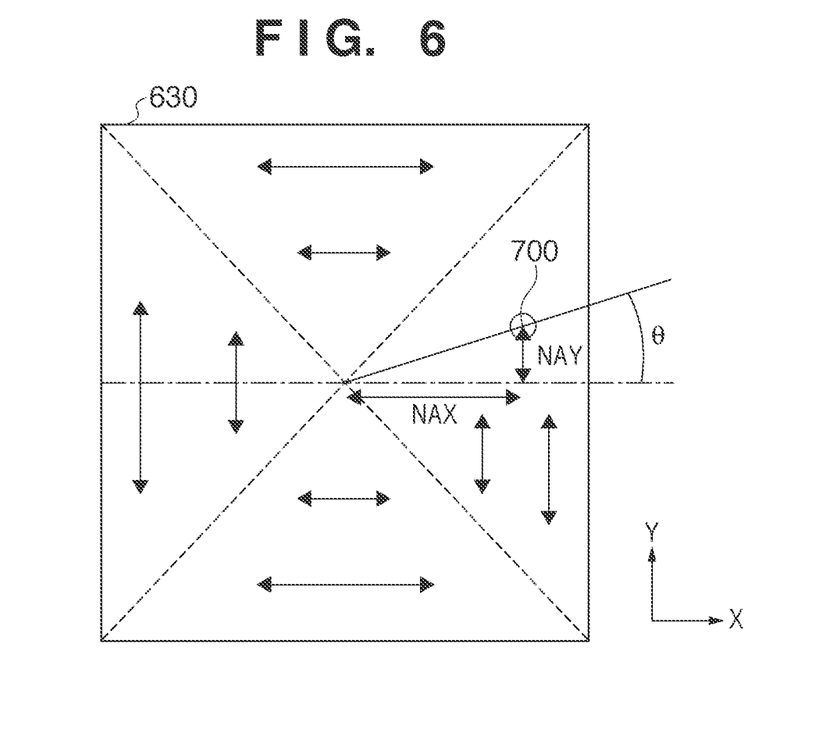
FIG. 6 is a view for explaining a method of creating a correction table.

Optical characteristics can be measured in various kinds of illumination modes as illustrated in FIG. 4. To do this, correction tables can be created if the P- and S-polarized light transmittances of the measurement device 200 are known at each coordinate position in the pupil. The non-polarization correction table 600 can be created based on the average of the P- and S-polarized light transmittances. FIG. 6 is a view for explaining a method of creating a correction table. In the correction table 630, the incident light is perfectly S-polarized on the X- and Y-axes. However, the incident light on the measurement device 200 is imperfectly S-polarized in a region other than the X- and Y-axes. Letting e be the rotation direction from the X-axis ($-45° \leq \theta \leq 45°$), a polarization correction amount (NAX,NAY) at a pupil coordinate position (NAX,NAY) is given by:

$$\text{Polarization Correction Amount }(NAX,NAY) = \text{S-polarized Light Transmittance }(NAX,NAY) \times \cos\theta + \text{P-polarized Light Transmittance }(NAX,NAY) \times \sin\theta \quad (1)$$

where S-polarized Light Transmittance (NAX,NAY) is the S-polarized light transmittance at the pupil coordinate position (NAX,NAY) and is calculated in Step 1002, and P-polarized Light Transmittance (NAX,NAY) is the P-polarized light transmittance at the pupil coordinate position (NAX, NAY) and is calculated in Step 1001.

Polarized light whose direction of polarization (direction of vibration) at the pupil coordinate position (NAX,NAY) is parallel to the X direction can be determined as S-polarized light, and that whose direction of polarization at the pupil coordinate position (NAX,NAY) is parallel to the Y direction can be determined as P-polarized light. Also, because the ratio between S-polarized light and P-polarized light is 1:1 on broken lines ($\theta = \pm 45°$) in the correction table 630, the incident light is regarded as non-polarized light on these lines. For other corrections as well, the polarization correction amount at each point in the pupil coordinate system can be calculated by obtaining the ratio between S-polarized light and P-polarized light in the direction of vibration of the incident light.

The foregoing description assumes that the ratio of S-polarized light to the total of S-polarized light and P-polarized light, that is, the degree of polarization is 100%. However, it is difficult to obtain 100% degree of polarization in actual illumination light (exposure light). The incident light on the photo sensor 250 of the measurement device 200 is influenced by a change in degree of polarization of illumination light (exposure light). To combat this situation, the polarization correction amount can be more precisely calculated by measuring the degree of polarization corresponding to an illumination mode in advance. A polarization correction amount (NAX,NAY) which takes into consideration the degree of polarization is given by:

$$\text{Polarization Correction Amount }(NAX,NAY) = \text{Degree of Polarization }(NAX,NAY)/100 \times \text{S-polarized Light Transmittance }(NAX,NAY) \times \cos\theta + (100 - \text{Degree of Polarization }(NAX,NAY))/100 \times \text{P-polarized Light Transmittance }(NAX,NAY) \times \sin\theta \quad (2)$$

where Degree of Polarization (NAX,NAY) [%] is the ratio of S-polarized light at the pupil coordinate position (NAX, NAY).

Although a method of calculating the polarized light transmittances based on the design values of the measurement device 200 or on both the design values and the measurement value of the degree of polarization, and creating a polarization correction table has been described, a correction table can also be created by another method. That is, P- and S-polarization correction tables can be created based on the outputs from the photo sensor 250 when ideal P-polarized light and S-polarized light are guided to the measurement device 200 during inspection of only the measurement device 200. This method is useful when it is difficult to obtain the polarized light transmittances of the photo sensor 250 from its design values.

According to this embodiment, optical characteristics can be measured with high accuracy even in a polarized illumination mode by correcting, the measurement result obtained by the measurement device 200, based on a correction table. This is useful for determining, for example, optimum exposure conditions in each polarized illumination mode by the control unit 190. The effective light source distribution measured using the measurement device 200 may be used for optical image performance simulation.

Second Embodiment

In the second embodiment of the present invention, when optical characteristics in a polarized illumination mode are measured using a measurement device 200, the measurement result obtained by the measurement device 200 is corrected based on pieces of polarized light transmittance information of the measurement device 200 and a projection optical system 140. This makes it possible to measure optical characteristics on the reticle surface (object plane) even in a polarized illumination mode.

A method of measuring optical characteristics in the second embodiment will be described with reference to FIG. 3. In Step 1001, the P-polarized light transmittances of the measurement device 200 and projection optical system 140 are calculated based on pieces of information concerning components which constitute the measurement device 200 and projection optical system 140. In Step 1002, the S-polarized light transmittances of the measurement device 200 and projection optical system 140 are calculated, like Step 1001. In Step 1003, correction tables are created based on the P- and S-polarized light transmittances of the measurement device 200 and projection optical system 140. Note that Steps 1001 to 1003 can be executed using, for example, a simulator based on the design values and other specifications of the measurement device 200 and projection optical system 140. Measurement of the light intensity distribution in the pupil of an illumination system 110 (Steps 1101 to 1105) is the same as in the first embodiment.

A difference from the first embodiment in Steps 1001 to 1003 will be supplemented herein. The positions where errors are generated in the polarized light transmittance are a wafer-side pattern 300 (the incident surface of a glass substrate 230), the exit surface of a planoconvex lens 240, the incident surface of a photo sensor 250, and the projection optical system 140. The polarized light transmittances of the measurement device 200 and projection optical system 140 can be obtained by calculating the polarized light transmittances of the measurement device 200 and projection optical system 140 in their pupil coordinate systems, and multiplying them. When the polarized light transmittances of the measurement device 200 and projection optical system 140 are obtained, correction tables can be created for each illumination mode, in the same way as in the first embodiment.

Exposure light experiences a difference in polarized light transmittance through a reticle-side pattern 400 placed on the object plane (reticle surface) as well. However, exposure light strikes the reticle-side pattern 400 at a small incident angle because of factors associated with the projection magnification of the projection optical system 140. Since the reticle-side pattern 400 has a small influence on a difference in polarized light transmittance, this influence is ignored in the second embodiment. As a matter of course, it is obvious that an influence that the reticle-side pattern 400 exerts on a difference in polarized light transmittance can be corrected.

A method of calculating the polarization transmittances of the measurement device 200 and projection optical system 140 based on their design values has been described above. However, the polarized light transmittance of the projection optical system 140 may change depending on an environmental factor such as the temperature or the force acting to hold an optical element, or upon mounting the projection optical system 140 into the exposure apparatus main body. For this reason, a function of measuring the polarization state of exposure light transmitted through the projection optical system 140 is installed on the exposure apparatus. It is possible to feed back the measurement result of the polarization state of exposure light transmitted through the projection optical system 140 to the value of the polarized light transmittance of the projection optical system 140. This makes it possible to measure optical characteristics on the reticle surface with high accuracy free from the influence of a temporal change of the projection optical system 140.

Figure 7A:
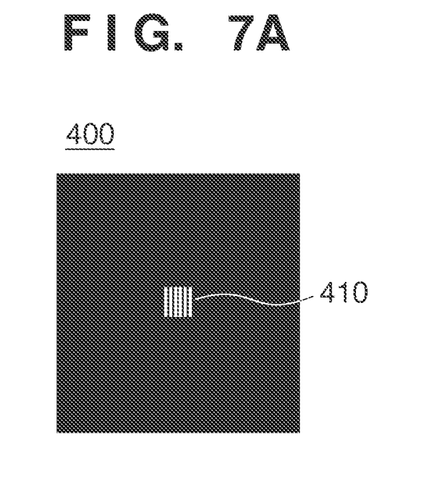
FIGS. 7A and 7B are views illustrating reticle-side patterns.
Figure 7B:
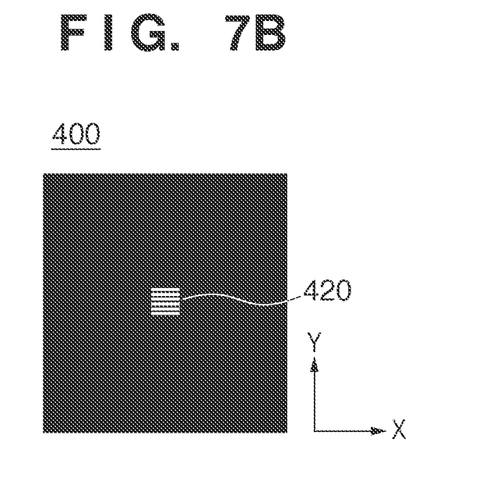

In addition to the method that uses the design values, the inspection results of constituent components, and the measurement result of the polarization state, another method directly measures the polarized light transmittance using the measurement device 200. Correction tables that take into consideration the polarized light transmittances of the projection optical system 140 and measurement device 200 can be created by generating ideal P-polarized light and S-polarized light in the exposure apparatus. FIGS. 7A and 7B illustrate reticle-side patterns 400. The reticle-side pattern 400 shown in FIG. 7A includes a pattern 410 in which slits with a width equal to or smaller than the wavelength of exposure light align themselves in the X direction. The slits are designed to have a distance between them, at which light beams having passed through adjacent slits do not interfere with each other. The reticle-side pattern 400 shown in FIG. 7A is illuminated in a polarized illumination mode in which the direction of vibration is parallel to the Y direction and in a non-polarized illumination mode. S-polarized ideal diffracted light diverges in the X direction from the slits in the polarized illumination mode, whereas non-polarized ideal diffracted light diverges in the X direction from the slits in the non-polarized illumination mode. The measurement device 200 measures the amounts of S-polarized ideal diffracted light and non-polarized ideal diffracted light, and calculates the ratio between the measured light amounts, thereby obtaining the polarized light transmittance ratio when P-polarized light and S-polarized light enter the slits aligning themselves in the X direction. Similarly, the polarized light transmittance ratio when P-polarized light and S-polarized light enter the slits aligning themselves in the Y direction is obtained using the reticle-side pattern 400 shown in FIG. 7B. The reticle-side pattern 400 shown in FIG. 7B includes a pattern 420 in which slits with a width equal to or smaller than the wavelength of exposure light align themselves in the Y direction. When the polarized light transmittance ratios of the projection optical system 140 and measurement device 200 are obtained, correction tables can be created using them. Although patterns in the X and Y directions have been adopted in FIGS. 7A and 7B, patterns in the 45° direction and 135° direction or those in other directions may be adopted.

As described above, in the second embodiment, correction tables for correcting the polarized light transmittances of the measurement device 200 and projection optical system 140 in their pupil coordinate systems are created when measurement is performed in a polarized illumination mode using the measurement device 200. Optical characteristics on the reticle surface can be measured with high accuracy even in a polarized illumination mode by correcting, the measurement results (distributions) obtained by the measurement device 200, using the created correction tables.

Application Example

A method of manufacturing devices (for example, a semiconductor device or a liquid crystal display device) according to one embodiment of the present invention will be described next. A method of manufacturing a semiconductor device will be explained as an example herein.

A semiconductor device is manufactured by a preprocess of forming an integrated circuit on a wafer, and a post-process of completing, as a product, a chip of the integrated circuit formed on the wafer by the preprocess. The preprocess can include a step of exposing a wafer coated with a photosensitive agent using the above-mentioned exposure apparatus, and a step of developing the wafer. The post-process can include an assembly step (dicing and bonding) and packaging step (encapsulation). Also, a liquid crystal display device is manufactured by a step of forming a transparent electrode. The step of forming a transparent electrode can include a step of coating a glass substrate, on which a transparent conductive film is deposited, with a photosensitive agent, a step of exposing the glass substrate coated with the photosensitive agent using the above-mentioned exposure apparatus, and a step of developing the glass substrate.

The method of manufacturing a device according to this embodiment can manufacture devices with a quality higher than that of devices manufactured by the prior arts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-157316, filed Jul. 1, 2009, which is hereby incorporated by reference herein in its entirety.

What is claimed is:

1. An exposure apparatus including an illumination system which illuminates an original with light, and a projection optical system which projects a pattern of the original onto a substrate, the apparatus comprising:
    a measurement device configured to measure a light intensity distribution on a pupil of the projection optical system; and
    a control unit configured to correct the light intensity distribution on the pupil measured by said measurement device, based on a polarization characteristic of said measurement device,
    wherein the polarization characteristic includes a polarized light transmittance of a component of said measurement device and depends on a direction of polarization of the light.

2. The apparatus according to claim 1, wherein:
    said measurement device is mounted on a substrate stage which holds the substrate,
    said measurement device includes an optical element configured to transmit light, and a photo sensor configured to detect the light transmitted through said optical element, and
    the component of said measurement device includes at least one of said optical element or said photo sensor having polarization characteristics corresponding to an illumination mode set in the illumination system.

3. The apparatus according to claim 1, wherein the polarization characteristics include a ratio of S-polarized light to the total of S-polarized light and P-polarized light.

4. The apparatus according to claim 1, wherein said control unit adjusts at least one of the illumination system or the projection optical system based on the corrected light intensity distribution on the pupil.

5. The apparatus according to claim 1, wherein said measurement device is configured to further measure at least one of a wavefront aberration of the projection optical system, a polarization state of light which passes through the projection optical system, a numerical aperture of the projection optical system, a transmittance in a pupil of the projection optical system, a light intensity distribution in a pupil of the illumination system, or a polarization state of light which passes through the illumination system.

6. The apparatus according to claim 1, wherein said control unit is configured to:
    obtain an S-polarized light transmittance and a P-polarized light transmittance of the component of said measurement device; and
    correct the light intensity distribution on the pupil measured by said measurement device, based on the S-polarized light transmittance and the P-polarized light transmittance of the component, and a degree of polarization on the pupil.

7. The apparatus according to claim 1, wherein said control unit is configured to:
    obtain a plurality of polarized light transmittances of the component of said measurement device, which correspond to a plurality of points in a pupil of the illumination system; and
    correct the light intensity distribution on the pupil measured by said measurement device, based on the plurality of polarized light transmittances.

8. A method of manufacturing a device, the method comprising the steps of:
    exposing a substrate using an exposure apparatus; and
    developing the substrate,
    wherein the exposure apparatus comprises:
    an illumination system which illuminates an original with light;
    a projection optical system which projects a pattern of the original onto a substrate;
    a measurement device configured to measure a light intensity distribution on a pupil of the projection optical system; and
    a control unit configured to correct the light intensity distribution on the pupil measured by the measurement device, based on a polarization characteristic of said measurement device,
    wherein the polarization characteristic includes a polarized light transmittance of a component of said measurement device and depends on a direction of polarization of the light.

* * * * *